United States Patent [19]

Chantraine et al.

[11] Patent Number: 5,082,718
[45] Date of Patent: Jan. 21, 1992

[54] METHOD FOR DEPOSITING AN INSULATING LAYER ON A CONDUCTIVE LAYER OF A MULTI-LAYER CONNECTION BOARD OF ONE VERY LARGE SCALE INTEGRATED CIRCUIT

[75] Inventors: Philippe Chantraine, Neuilly-Sur-Seine; Marta Zorrilla, Fontenay-Le-Fleury, all of France

[73] Assignee: Bull S.A., Paris, France

[21] Appl. No.: 556,488

[22] Filed: Jul. 24, 1990

[30] Foreign Application Priority Data

Jul. 27, 1989 [FR] France ................. 89 10158

[51] Int. Cl.⁵ ....................... B32B 3/00; B44C 1/22
[52] U.S. Cl. ........................ 428/209; 156/643; 156/655; 156/668; 156/902; 428/137
[58] Field of Search ............. 156/643, 644, 646, 655, 156/656, 657, 659.1, 668, 902, 901; 174/250, 255, 261, 266; 427/38, 39, 96, 97; 357/65, 67, 71; 428/209, 137; 361/397, 400, 412; 437/189, 192, 193, 194, 195, 197, 228, 233, 238, 241, 245, 246

[56] References Cited

U.S. PATENT DOCUMENTS

| | | | |
|---|---|---|---|
| 4,218,283 | 8/1980 | Saiki et al. | 156/656 |
| 4,367,119 | 1/1983 | Logan et al. | 156/643 |
| 4,519,872 | 5/1985 | Anderson et al. | 156/668 X |
| 4,520,041 | 5/1985 | Aoyama et al. | 156/656 X |
| 4,605,470 | 8/1986 | Gwozdz et al. | 156/643 |
| 4,622,058 | 11/1986 | Leary-Renick et al. | 156/663 X |
| 4,670,091 | 6/1987 | Thomas et al. | 156/644 X |
| 4,673,773 | 6/1987 | Nakano et al. | 174/68.5 |
| 4,700,473 | 10/1987 | Freyman et al. | 29/846 |
| 4,710,592 | 12/1987 | Kimbara | 174/68.5 |
| 4,830,691 | 5/1989 | Kida et al. | 156/631 |
| 4,946,550 | 8/1990 | Vanloathoven | 156/668 X |
| 4,963,697 | 10/1990 | Peterson et al. | 174/252 |
| 4,984,132 | 1/1991 | Sakurai et al. | 361/414 |

FOREIGN PATENT DOCUMENTS

| | | |
|---|---|---|
| 0256778 | 5/1988 | European Pat. Off. |
| 0247575 | 7/1988 | European Pat. Off. |
| 2133156 | 11/1972 | France |
| 2622384 | 4/1989 | France |
| 1006498 | 10/1965 | United Kingdom |

OTHER PUBLICATIONS

IBM Technical Disclosure Bulletin, vol. 21, No. 4, Sep. 1978, Tomas et al., "Multilayer Laminated Chip Carrier".

Primary Examiner—William A. Powell
Attorney, Agent, or Firm—Kerkam, Stowell, Kowdracki & Clarke

[57] ABSTRACT

A method for deposition of an insulating layer on a conductive layer of the multi layer structure of a connection board of a VLSI circuit and a connection board formed by the method. The formation of an insulating layer coplanar with the upper surface of the vias (21) of the conductive layer (16a, 16b) is done by etching of an insulating layer (26) formed of a plurality of successive strata (22, 23, 24, 25) until a surface is obtained that has steps of a maximum height (S4) substantially equal to or less than a desired valve (V) corresponding to the desired degree of planarity of the final insulating layer.

21 Claims, 4 Drawing Sheets

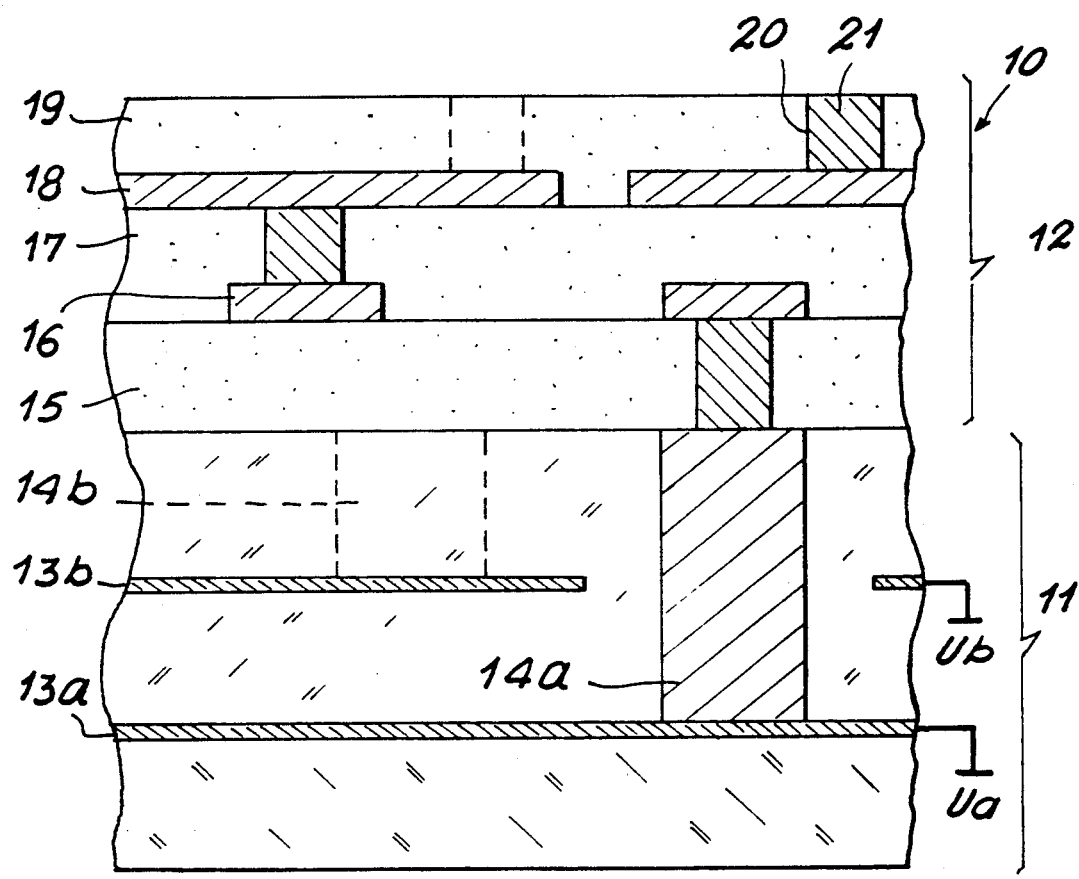

METHOD FOR DEPOSITING AN INSULATING LAYER ON A CONDUCTIVE LAYER OF A MULTI-LAYER CONNECTION BOARD OF ONE VERY LARGE SCALE INTEGRATED CIRCUIT

CROSS-REFERENCE TO RELATED APPLICATION

This application is related to our copending application, Case 3082, entitled "Method for Forming the Multi-Layer Structure of a Connection Board of at Least One Very Large Scale Integrated Circuit", Ser. No. 556,487, filed July 24, 1990 in the name of Philippe Chantraine and Marta Zorrilla and which is assigned to the assignee of the present invention.

FIELD OF THE INVENTION

The invention relates to a method for deposition of an insulating layer on a conductive layer of the multi-layer structure of a connection board of at least one very large scale integrated circuit, or VLSI chip. The board may be used to interconnect several surface mounted integrated circuits, or simply to carry an integrated circuit located in a package, for example as a substitute for the conventional substrate commonly known as a chip carrier.

BACKGROUND OF THE INVENTION

In such a board, the multi-layer structure is ordinarily supported by a substrate made of an insulating slab that incorporates the distribution planes of the supply voltages of the integrated circuit or circuits. The substrate may be a slab of co-fired ceramic, or a slab made of some organic material, such as plastic. However, the board may be simply formed of the multi-layer structure, taking the form of a flexible board.

Alternatively, the board may be a slab of semiconductor material incorporating integrated circuits and covered with a multi-layer structure for interconnection of these integrated circuits by the WSI (wafer scale integration) technique. In all these boards, the multi-layer structure comprises a stack of alternating conductive and insulating layers. In this stack, an insulating layer is pierced with via-holes for electrical connection of the adjacent conductive layers. The conductive layer is ordinarily made of aluminum or copper, and at present, the insulating layer is preferably made of a polymerized material such as polyimide.

One problem in the manufacture of the multi-layer structure is in obtaining relatively planar layers. One conventional manufacturing method comprises forming the conductors of a conductive layer and covering the conductive layer with an insulating layer of polymerizable material in the form of viscous liquid, known in this field as paste. This paste has the advantage of having a surface area with steps or lower levels that are not as high as the corresponding edges of the conductors underneath. This method may comprise spreading a drop of polymerizable material by centrifugal force, or spray application of the paste, or making a coating of the paste, for example by serigraphy. The paste is then polymerized. Naturally this method is used under conditions that lend the polymerized layer the great thickness required to assure the desired insulating between two conductive layers one on top of the other. The insulating layer is covered with a mask that defines the location of the via-holes to be formed. In a conventional embodiment, the via-holes are flared, and the conductors of the upper conductive layer extend on the insulating layer and on the walls of the via-holes that have just been formed, as well as over the regions of the conductors making up the bottom of the via-holes. The result is an upper conductive layer provided with numerous depressions at the level of the via-holes. Understandably, stacking numerous layers accentuates the depth of the depressions and consequently entails the risk of creating discontinuities in the conductive layers deposited. Moreover, the formation and flaring of the via-holes are delicate steps in the method.

One improvement to this method comprises avoiding the superposition of via-holes by offsetting them in a spiral about a vertical line. A first disadvantage of this is that it reduces the density of the via-holes in the same insulating layer and consequently reduces the overall density of conductors in the multi-layer structure. A second advantage is that although the staggered disposition of the via-holes is quite fast, it limits the number of reliable layers in the structure. For example, disposing them in a spiral 90° from one another means that a via-hole in the fifth layer is superimposed on a via-hole of the first layer and undergoes the deformations occasioned by the four via-holes in between. In practice, this method is ordinarily limited to the deposition of on the order of five superimposed conductive layers.

A more recent solution to the problem has been to form vias on the conductors of a conductive layer and to cover all of this with a paste that is polymerized to obtain the insulating layer. The insulating layer has the great thickness required to assure the desired insulation between two superimposed conductive layers and covers the vias with a lesser thickness of insulating material. The insulating layer is covered with a mask that has the configuration of the via-holes. Next, a selective attack of the insulating layer is performed to uncover the upper surfaces of the vias and to flare the via-holes. Because of the vias, these via-holes are markedly less deep than those obtained by the method described in the previous paragraph. The upper conductive layer is accordingly relatively more flattened or planarized.

The problem that this solution presents will become quite clear from the following example of a conventional method of forming a polymerized insulating layer on a conductive layer provided with vias. It is assumed that the conductive layer is formed on a plane reference surface composed of conductors having a height provided with vias of height hH with respect to the reference surface. A drop of a viscous polyamic acid paste is deposited on this conductive layer. By rotation, the drop spreads over the entire conductive layer along a thickness T0 which is a function of the viscosity of the paste, the speed of rotation, and the relief of the conductive layer. In an oven, prefiring of the paste is performed. The temperature of the prefiring must be less than the temperature of imidization (on the order of 220° C.) at which the polymerization of the paste begins. The prefiring solidifies the polyamic acid and eliminates some of the solvent incorporated in the paste. The amount of solvent eliminated depends on the prefiring temperature, which in practice is between 130 and 200° C. The thickness T1 of the prefired layer depends on the quantity of solvents remaining in the layer and consequently on the pre firing temperature and on the nature of the paste. The thickness T1 of a standard prefired face in the vicinity of the imidization temperature may be reduced to approximately 40% of the thickness T0 of the paste. The prefired layer is then polymerized, at a temperature ordinarily on the order of 400° C. The resulting polyimide layer has a thickness T2 that is less than the thickness T1 by a magnitude depending on the nature of the paste and on the prefiring temperature. In total, for an ordinary paste, the thickness T2 is on the order of 50% of the thickness T0 of the initial paste layer. The polyimide surface is entirely planar and has steps at the level of the edges of the conductors and of the vias.

Let s be the height of the step relative to the h of a conductor, and let S be the height of a step relative to the height H of a via with respect to the surface of the insulating layer underneath it. The planarization factor of the insulating layer is defined by a number currently known as the DOP factor (degree of planarization) = $1 - s/h$. This formula is valuable regardless of the value h and as long as the height of the paste initially spread over the conductive layer is substantially equal to or greater than the value h. Consequently, under the same conditions, the DOP factor = $1 - S/H$. The DOP factor of a current standard layer is on the order of 0.4. This means that if $h = 5$ micrometers, $s = 3$ micrometers, and if $H = 20$ micrometers, $S = 12$ micrometers.

The size of the step S due to the vias currently makes it necessary to reduce the height H of the vias. However, the insulating layer must have a relatively high minimum thickness to assure good electrical insulation between the superimposed conductive layers. Hence if the height of the vias is not great, it is necessary to make relatively deep via-holes in the insulating layer. With the current standard products, the practice of introducing vias into the conductive layer makes a relatively slight improvement, for improving the planarity of an insulating layer, compared with the conventional method described above. To reduce the height of the steps, manufacturers are currently studying products having a higher DOP factor. However, in conventional technology the steps remain and must be opened, uncovering the upper faces of the vias, in order to form via-holes. Forming the via-holes is a delicate operation. It in fact requires the deposition of a mask and the very precise position of openings defining the locations of the via-holes above the vias. Furthermore, the duration of etching is conventionally determined by optical means, which detect the appearance of the metal of the vias. In the present case, these optical means must act inside the via-holes, which makes the detection of the metal difficult. If the detection is done prematurely, then the presence of a remaining film of polyimide will affect the electrical quality of the contact of the via with the upper conductive layer.

Hence the current problem is of using ordinary pastes which are less expensive and are reliable, to obtain a substantially planar surface regardless of the height of the vias of the conductive layer below it, and of no longer making via-holes in the substantially planar insulating layer. Hence this method would have the advantage of stacking a large number of reliable conductive layers, which are insulated correctly and reliably by substantially planar insulating layers. Such a method is the subject of the invention.

OBJECT AND SUMMARY OF THE INVENTION

The method according to the invention for forming a multi-layer structure for connection of at least one very large scale integrated circuit, including the formation of an insulating layer on a conductive layer and the etching of the insulating layer to uncover predetermined portions of the conductive layer, is characterized in that the insulating layer is made from a material having a degree of planarization (DOP) enabling the obtaining of a surface having steps of a maximum height (S) substantially equal to or less than a desired value (V), and that the etching is done uniformly over the entire surface of the insulating layer.

The result is a connection board for at least one very large scale integrated circuit, including a multi-layer structure comprising alternating conductive and insulating layers, each conductive layer including conductors topped with vias, characterized in that the insulating layers are substantially coplanar with the upper faces of the vias of the conductive layer beneath them.

The characteristics and advantages of the invention will become apparent from the ensuing detailed description, given by way of example, taken in conjunction with the accompanying drawings.

BRIEF DESCRIPTION OF THE DRAWINGS

FIG. 1 is a fragmentary cross-sectional view of a connection board for at least one very large scale integrated circuit, which includes a multi-layer structure obtained by the method according to the invention;

DESCRIPTION OF THE PREFERRED EMBODIMENTS

Figure 2A:
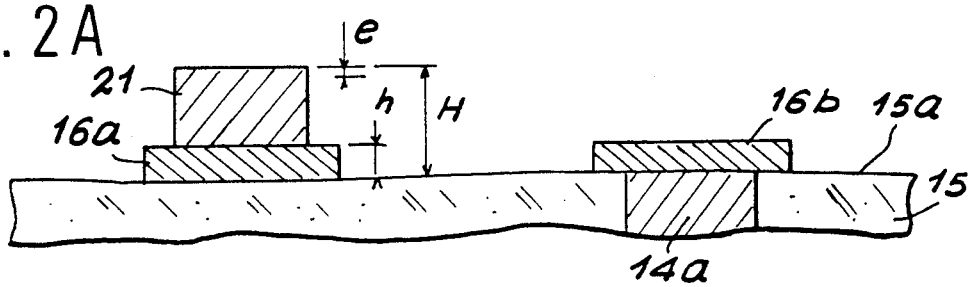
FIGS. 2A-2H are fragmentary views of the multi-layer structure shown in FIG. 1, illustrating the successive phases of a method according to the invention for forming the second insulating layer of the multi-layer structure.

FIG. 1 shows a board 10 according to the invention, seen in fragmentary section. The board 10 comprises a substrate 11 that on its surface carries a multi-layer structure 12 for connection of at least one very large scale integrated circuit, not shown. The substrate 11 is ordinarily a solid slab made from an electrically insulating material, for example ceramic, incorporating conductive or potential planes 13a, 13b for distributing the respective potentials Ua, Ub for supplying the integrated circuit which are to be mounted on the board. Numerous conductor vias 14a, 14b pass through the substrate 11, making contact with the respective potential planes 13a, 13b and emerging on the same face of the substrate 11. The multi-layer structure 12 is formed on this face of the substrate 11 and comprises a stack of alternating conductive and insulating layers, including a first insulating layer 15, a first conductive layer 16, a second insulating layer 17, a second conductive layer 18, and a third insulating layer 19, intended to support the integrated circuit. The insulating layers 15, 17, 19 are provided with via-holes 20 for the electrical connection of the conductor planes 14 and conductive layers 16 and 18 to the integrated circuit, not shown. Each via-hole 20 contains one conductor via 21 having the height of the via-hole and, in the example shown, having a substantially uniform cross section. The vias 21 may have a cylindrical or prismatic cross section.

FIGS. 2A-2H are views illustrating the successive phases of a first method according to the invention for forming any of the insulating layers, for this example this being selected as the second insulating layer 17 on the conductive layer 16 of the multi-layer structure 12 shown in FIG. 1. FIG. 2A shows the first step in the method. The conductive layer 16 is composed of two conductors 16a, 16b deposited on the insulating layer 15 and formed according to the invention. In order to better illustrate the characteristics of the invention, the insulating layer 15 is assumed to have a planar upper surface 15a, as shown, serving as a reference for the various heights and thicknesses that will be given. In the example shown, the conductors 16a, 16b, like all the other conductors of the layers 16 and 18, have a height h = 5 micrometers. The conductor 16a shown has a via of height H = 17 micrometers. The conductor 16b shown is a contact with a subjacent via 14a of the insulating layer 15. In the structure 12 made, the vias were formed on the enlarged bases of the conductors of a conductor layer and had a final height H = 15 micrometers. A particular feature of the exemplary method shown in FIGS. 2A-2H comprises initially forming vias having a slightly greater height (H = 17 micrometers) having an oversize extra height e (of 2 micrometers, for example) with respect to the final height desired, for reasons which will become clear hereinafter.

Figure 2B:
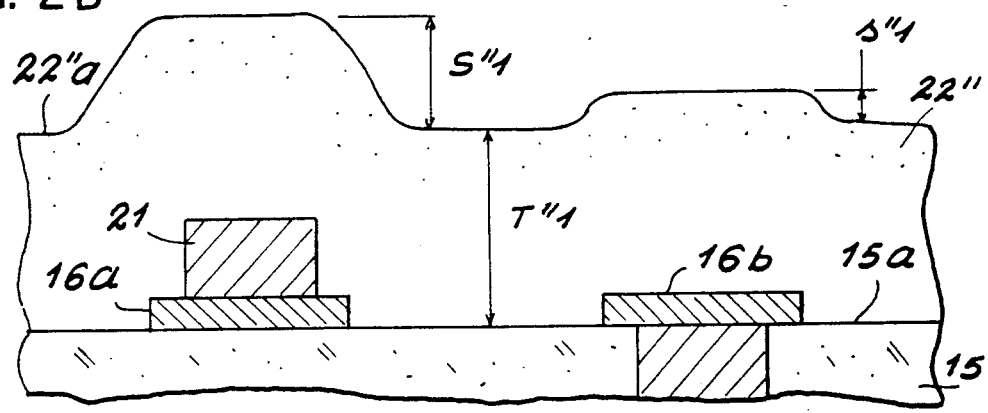
Figure 2C:
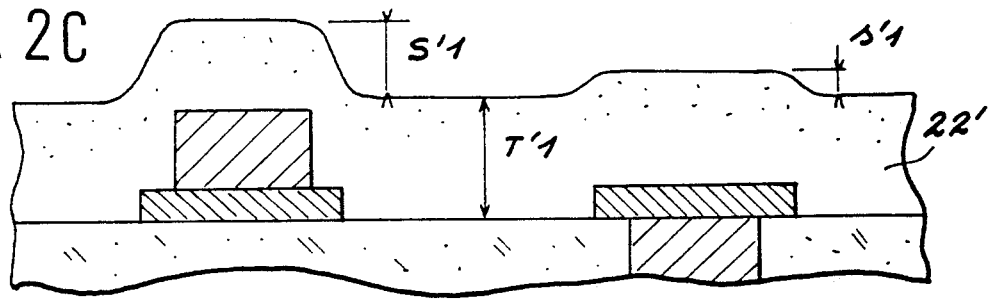
Figure 2D:
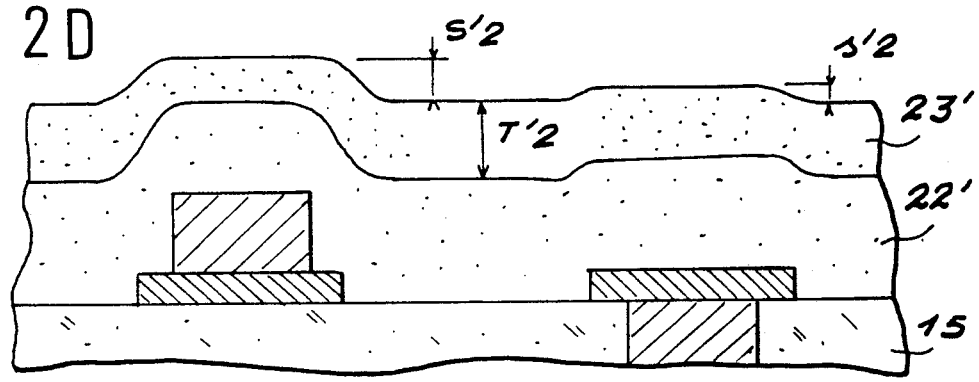
Figure 2E:
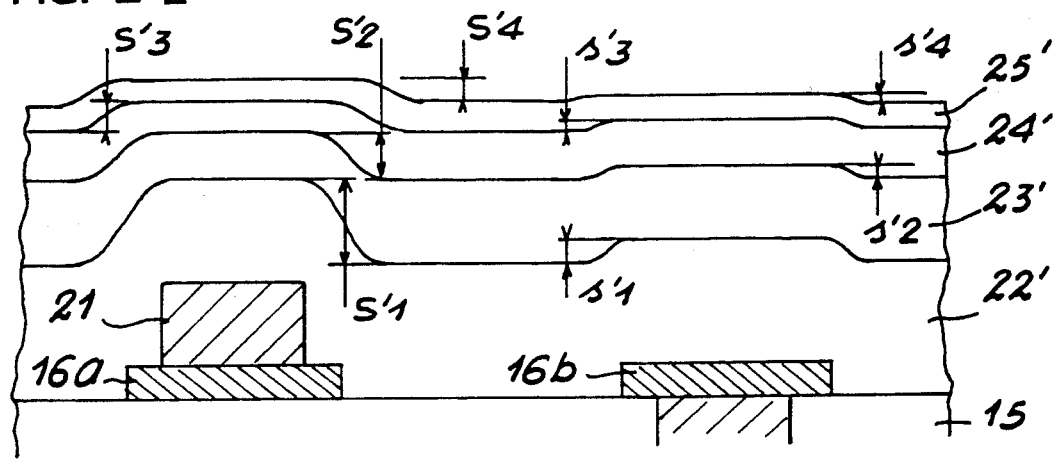
Figure 2F:
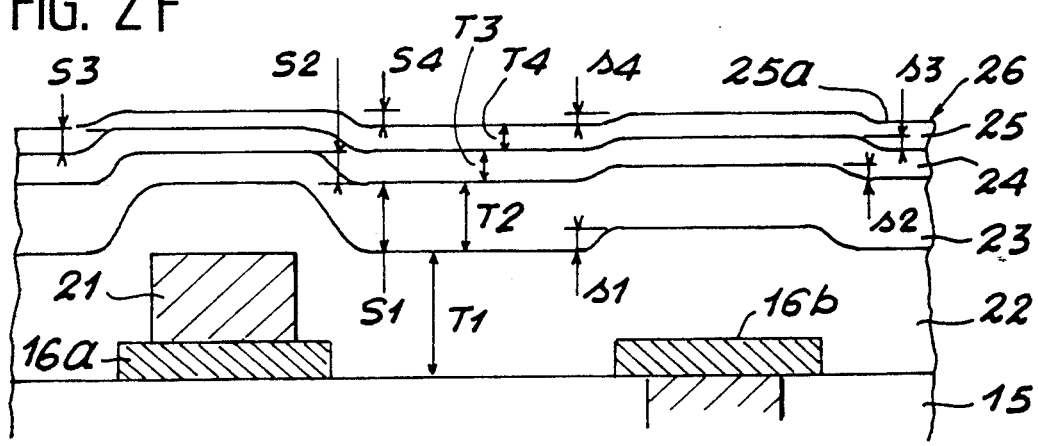

FIGS. 2B and 2C respectively show two phases of the conventional method for forming an insulating layer from a polymerizable material on a conductive layer. On the conductive layer 16 shown in FIG. 2A, a drop of a paste of polyamic acid currently used at present, such as that made by DuPont de Nemours, reference No. PI 25-25, has been used, the planarization factor DOP of which is 0.4. The board 10 in this state has been made to rotate in order to spread the paste uniformly, by centrifugal force, over the entire conductive layer 16 so as to obtain a paste layer 22'' having a thickness T''1 with respect to the reference surface 15a. Taking into account the DOP factor of the paste, the upper surface 22''a of the layer 22'' has steps s''1 at the level of the lateral (i.e., vertical) faces of the conductors alone without vias such as the conductor 16b, and steps of height S''1 at the level of the lateral faces of the vias 21 carried by their associated conductors, such as the conductor 16a. Next, the board 10 is placed in an oven to prefiring of the paste layer 22''. The prefiring is done at a temperature lower than the temperature of imidization of the paste (20° C.). As a function of the temperature, the paste of the layer 22'' gives up some of its solvents and is in the form of a solidified mass of polyamic acid. A solidified layer of polyamic acid 22' is thus obtained (FIG. 2C) having a thickness T'1 substantially reduced from the thickness T''1 of the layer 22'' (FIG. 2B). The corresponding steps s'1 and S'1 have heights that are reduced by the same ratio.

A conventional method for forming an insulating layer in a multi-layer structure 12 comprises subsequent imidization of the layer 22'. The result is a layer 22 (FIGS. 2F) having a thickness T1 and having steps s1 and S1 that are proportional by the same ratio. This method continues with a selective attack of the layer 22 in order to expose the upper faces of the vias 21.

The method according to the invention comprises forming a plurality of successive polyimide strata 23, 24, 25 (FIG. 2F), on layer 22 until an upper surface 25a is attained that has steps s4, S4 of a maximum height substantially equal to or less than a desired value V. In the example selected, the desired value V was on the order of 2 micrometers. The layer 22 serving as a first stratum on surface 15 had a thickness substantially equal to the height H = 17 μm of the vias 21. Given the DOP factor = 0.4, the surface 22a of the stratum 22 had steps S1 = 10.2 micrometers and s1 = 3 micrometers. The paste layer 22'' (FIG. 2b), under these conditions, had a thickness T''1 = approximately 30 micrometers, and steps S''1 = 18 micrometers and s''1 = 5 micrometers, approximately. Prefiring was done at approximately 200° C. for one hour, in order to produce the stratum 22' (FIG. 2C) having a thickness T'1 = 19 micrometers and steps S'1 = 11 micrometers and s'1 = 3 micrometers, approximately.

The second polyimide stratum 23 (FIG. 2F) was formed in the same manner as in FIGS. 2B and 2C, taking the steps S1 and s1 of the first stratum 22 as the equivalent of the heights H and h of the conductive layer 16 shown in FIGS. 2A. In other words, the steps S2 and s2 of the second stratum 23 are given by the formula of the DOP factor: 0.4 = 1 - S2/s1 = 1 - s2/s1. Taking it as a rule that a paste is spread in such a manner as to obtain a polyimide layer thickness practically equal to the greatest step height, the second stratum 23 had a thickness T2 = S1 = 10 micrometers, and its surface 23a had steps S2 = 6 micrometers and s2 = 2 micrometers. The second polyimide stratum 23 was obtained from a stratum of polyamic acid 23' (FIG. 2D) prefired under the same conditions as the stratum 22' of FIG. 2C. The mass of the stratum 23' is higher, given that it has not yet been imidized.

Similarly, a third stratum 24' (FIG. 2E) has been deposited and prefired and is then imidized to obtain the stratum 24 (FIG. 2F), having a thickness T3 = S2 = 6 micrometers and steps having height S3 = 3.6 micrometers and s3 = 1 micrometer. Given that the step S3 is clearly greater than the maximum desired value V = 2 micrometers, a fourth step 25' (FIG. 2E) has been formed in such a way that after imidization the fourth polyimide stratum 25 (FIG. 2F) is obtained, having a thickness T4 = S3 = 3.6 micrometers and steps of height S4 = 2 micrometers and s4 = 0.7 micrometer. The fourth stratum 25 is the last, since its steps of maximum height S4 are substantially equal to the desired value V. The stratified insulating layer 26' is thus obtained.

Figure 2G:
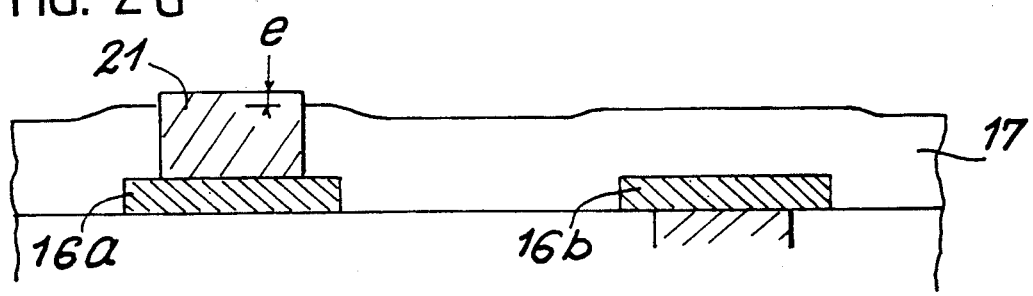

In practice, each of the strata 22'-25' (FIG. 2E) is obtained by prefiring, and then imidization of the entire mass of prefired polyamic acid of the layer 26' is performed. In the example selected, the board 10 has undergone a firing at 400° C. for a cycle on the order of 1 hours, to effect the imidization of the layer 26'. The result is the stratified layer of polyimide 26 of FIG. 2F. The layer 26 is then etched anisotropically and uniformly, until the upper faces of the vias 21 are exposed. Under these conditions, the final insulating layer 17 is obtained (FIG. 2G). Given that the etching does not modify the topology of the face 25a of the last stratum 25, the layer 17 has steps having the same heights S4 and s4 as the fourth stratum 25. The etching was performed by the conventional method with a plasma of ions that are reactive in oxygen associated with a compound containing fluorine, a method better known as plasma reactive ion etching. This method has the advantage of a speed of attack of approximately 0.7 micrometer per minute, or in other words is 3 to 4 times faster than the more usual method of etching with plasma in pure oxygen.

Figure 2H:
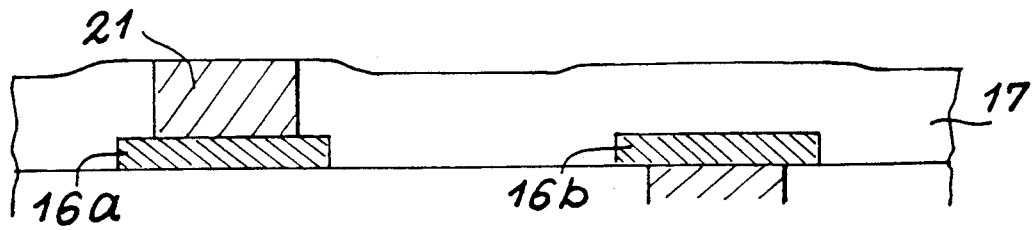

In a characteristic of the invention, etching of the polyimide layer 26 is not stopped at the level of the upper face of the via 21 shown in FIG. 2G, but at a slightly lower level, by the magnitude e (2 micrometers, in the example actually made) shown in FIG. 2A. The elimination of the upper 2 micrometers of the vias 21 puts them at the same level as the surrounding polyimide of the layer 17 (FIG. 2H). This elimination solves one problem in the prior art. By this technique, it has been seen that the layer 22' in FIG. 2C was imidized, and then etched, so expose the upper face of the vias 21. However, the microscopic surface defects of the metal of the vias 21 contribute to leaving polyimide residues and altering the mechanical and electrical quality of the contacts between the vias and the conductors of the upper layer. The invention makes it possible to furnish a metal surface that is free of polyimide on each via 21. This etching was obtained by an ionic method, but it could also be done by mechanical abrasion or by chemical attack, in particular.

The invention has numerous advantages. Essentially, it provides a method for forming a substantially planar insulating layer regardless of the height of the vias of the subjacent electrical layer. Furthermore, the uniform etching of the stratified insulating layer produces a final insulating layer that is coplanar with the vias, while having the thickness that assures the desired electrical insulation between two superimposed conductive layers. Additionally, the uniform etching makes the steps of depositing a mask and positioning it to form via-holes unnecessary, and it affords a clearly improved sensitivity for determining the end of the etching. In fact, the contrast between the metal surfaces and polyimide surfaces is clearly apparent over the entire substantially planar surface of the stratified layer and it lends good control of the etching process. This advantage has been profitably used by slightly (by 2 micrometers) raising the height of the vias 21, in order that they can be reduced further in order to provide a metal surface that assures reliable mechanical and electrical contact. On the other hand, the method of forming the stratified insulating layer uses only the well-known, well-mastered steps of forming a polyimide layer. Finally, a method according to the invention may appear in various variant forms, as will now be shown.

Figure 3A:
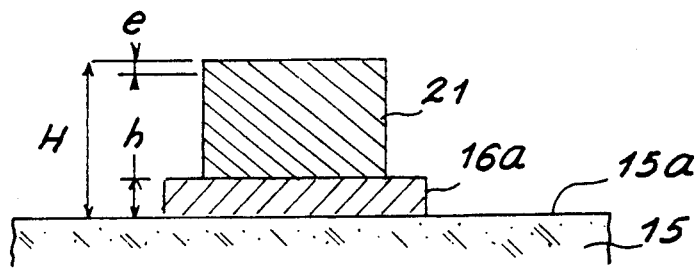
FIGS. 3A-3E are detail views on an enlarged scale of the multi-layer structure shown in FIG. 1, illustrating successive phases of a variant of the method according to the invention for forming the second insulating layer of the multi-layer structure of FIG. 1.
Figure 3B:
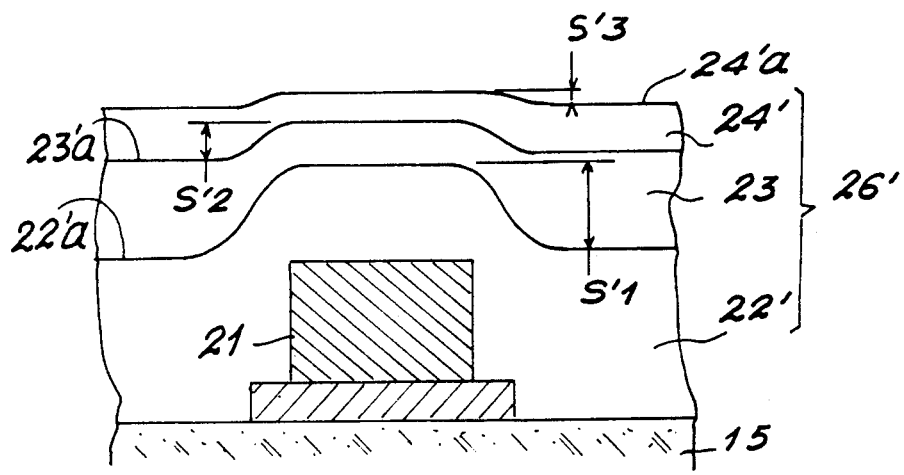

FIGS. 3A–3E are detailed views on a larger scale at the level of a conductor topped with a via of the conductive layer 16, showing the successive phases of a second method according to the invention for forming the second insulating layer 17 of the multi-layer structure 12 shown in FIG. 1. FIGS. 3A and 3B correspond to the two FIGS. 2A and 2E. In FIG. 3A, the insulating layer 15, formed in accordance with the method of the invention and having a reference surface 15a that is assumed to be planar, carries a conductor 16a of height $h = 5$ micrometers topped with a view 21 of height $H = 17$ micrometers. As in the first method described above, the object is to have a final insulating layer 17 having steps of height S equal at most to V, which equals approximately 2 micrometers. The paste used is made by General Electric and has a DOP factor of 0.5, yielding a siloxane polyimide. The successive strata obtained by spraying of the paste followed by prefiring are shown in FIGS. 3B. In the example shown, the thickness of each stratum is approximately equivalent to the height of the steps of the subjacent layer, as in the preceding method. By applying the formula of the DOP factor, which is valid for an imidized layer, the step S1 calculated is 8.5 micrometers. Corresponding to this value, for the paste layer 22' fired at 200° C., is a slightly higher step, on the order of 10 micrometers. The second prefired paste layer 23' was deposited to obtain a second polyimide stratum having a calculated step S2 of 4.25 micrometers. Corresponding to this value, on the surface 23'a of the layer 23', is a step S'2 of slightly less than 5 micrometers. The application of a third layer 24' produces a step S3 the calculated value of which is 2.12 micrometers. The surface 24'a of the third prefired paste stratum 24' thus has a step of approximately 2.5 micrometers. It is important to note that the largest steps of height S3 in the third stratum 24, resulting from the imidization of all the layers of FIG. 3B, are substantially equal to the predetermined desired value of 2 micrometers for the final insulating layer 1. Consequently, in the example shown, this value has been obtained by depositing only three strata.

Figure 3C:
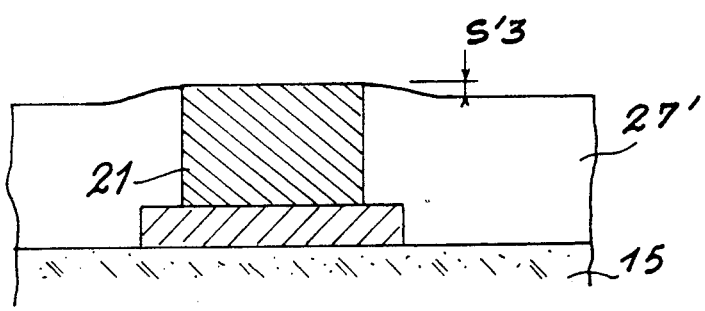
Figure 3D:
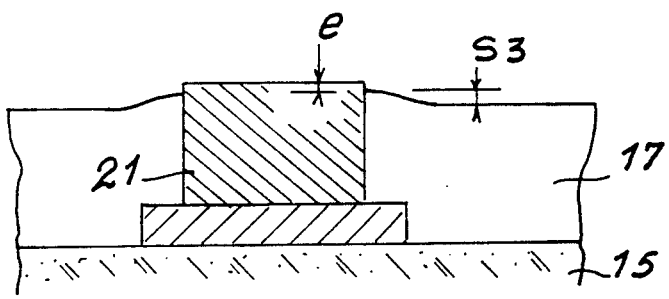
Figure 3E:
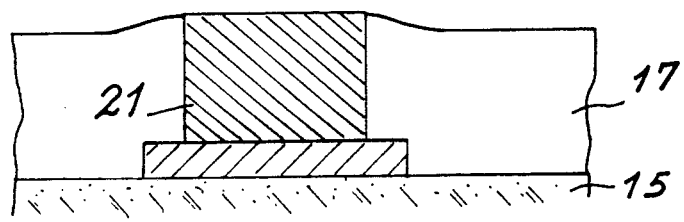

According to the second method, the etching has been done prior to imidization of the layer 26' formed by the three strata 22', 23' and 24'. In practice, the etching was done in a solution of pure hydrazine hydrate, at a speed on the order of 0.4 micrometers per minute. The etching is stopped at the instant when the upper face of the vias 21 appears. The etched layer 27' thus obtained is shown in FIG. 3C. The board 10 then undergoes firing at 400° C. for a cycle of approximately 11 hours, to effect the imidization of the layer 27'. The final polyimide insulating layer 17 has thus been formed (FIG. 3D). This layer reproduces the steps of the surface 24' of FIG. 3B. Taking the imidization into account, the steps have a maximum value on the order of 2 micrometers, as desired. After imidization and the elimination of the solvents that the prefired paste layer 27' contained (FIG. 3C), the layer 17 is retracted slightly, or shrunken, and is located at a level slightly lower than that of the upper surface of the vias 21. The corresponding elimination of the metal of the vias to put them at the level of the insulating layer 17 (FIG. 3E) makes it possible, as in the preceding method, to obtain a metal surface free of polyimide and to assure good contact with the upper conductive layer 18.

Another exemplary embodiment relates to a board carrying vias having a height $H = 17.3$ micrometers, and used a polyimide paste, the brand name of which is THERMID EL-5512, made by the Starch and Chemical Corporation in the United States. Three successive layers were deposited in accordance with the first method described with respect to FIG. 2, with the difference that the final layers each had a thickness equal to approximately 10 micrometers. Three layers were sufficient to obtain a step $S3 = 1.7$ micrometer. The etching is done with reactive ion plasma based on oxygen and a gas containing fluorine. The speed of attack was approximately 0.6 micrometer per minute.

Generalization of the method according to the invention can be done with reference to the DOP factor. For the first stratum 22, $DOP = 1 - S1/H$, hence $S1 = H(1 - DOP)$. For the second stratum 23, $DOP = 1 - S2/S1$, hence $S2 = S1(1 - DOP) = H(1 - DOP)^2$. By iteration, $Sn = H(1 - DOP)^n$. Consequently, the principle of the invention comprises artificially raising the DOP factor of a polymerizable material, comprising a stratified layer. The limit case of the invention is that using a material the DOP factor of which is sufficient to obtain maximum steps S substantially equal to or less than the desired value V, with a single layer having the requisite thickness to assure the desired insulation between adjacent superimposed conductive layers. In this case, it is sufficient to perform a uniform etching of this layer, to produce the final desired layer, such as that shown in FIG. 1.

It should be noted that the method is not limited to polyimide and can be applied to any polymerizable paste, polymer or any other insulating material that spreads by a predetermined DOP factor.

What is claimed is:

1. A method for forming a multi-layer structure (12) for connection of at least one integrated circuit, comprising forming on a bottom surface (15a) a conductive layer (16, 21) having a maximum height (H) over said bottom surface and forming on the conductive layer an insulating layer of a material having a predetermined planarization factor (DOP) to obtain a top surface (25a) having steps no higher than a predetermined maximum height value (V), said insulating layer being formed of a number n of strata calculated so that $H(1-DOP)^1$ results in a step height value (Sn) equal to or lower than said maximum height value (V), wherein n is an integer $\geq 1$.

2. The method of claim 1, characterized in that it comprises stratifying the insulating layer by forming a plurality of successive strata of said material.

3. The method of claim 2, characterized in that the insulating layer is made from a polymerizable material.

4. The method of claim 3, characterized in that each stratum is formed from a layer of paste prefired at a temperature less than the temperature of polymerization.

5. The method of claim 3, characterized in that the etching is performed prior to polymerization of the stratified insulating layer.

6. The method of claim 4, characterized in that the etching is performed prior to polymerization of the stratified insulating layer.

7. The method of claim 3, characterized in that the etching takes place after polymerization of the stratified insulating layer.

8. The method of claim 4, characterized in that the etching takes place after polymerization of the stratified insulating layer.

9. The method of claim 2 characterized in that it comprises initially forming vias on the conductive layer and elevating the vias (21) on the conductive layer by a magnitude (e), etching the stratified insulating layer to obtain a layer placed under the upper face of the vias of the magnitude (e), and eliminating the upper portion (e) of the vias to make them coplanar with the surface of the etched insulating layer.

10. The method of claim 3 characterized in that it comprises initially forming vias on the conductive layer and elevating the vias (21) on the conductive layer by a magnitude (e), etching the stratified insulating layer in such a manner as to obtain a layer placed under the upper face of the vias of the magnitude (e), and eliminating the upper portion (e) of the vias to make them coplanar with the surface of the etched insulating layer.

11. The method of claim 4 characterized in that it comprises initially forming vias on the conductive layer and elevating the vias (21) on the conductive layer by a magnitude (e), etching the stratified insulating layer in such a manner as to obtain a layer placed under the upper face of the vias of the magnitude (e), and eliminating the upper portion (e) of the vias to make them coplanar with the surface of the etched insulating layer.

12. The method of claim 5 characterized in that it comprises initially forming vias on the conductive layer and elevating the vias (21) on the conductive layer by a magnitude (e), etching the stratified insulating layer in such a manner as to obtain a layer placed under the upper face of the vias of the magnitude (e), and eliminating the upper portion (e) of the vias to make them coplanar with the surface of the etched insulating layer.

13. The method of claim 7 characterized in that it comprises initially forming vias on the conductive layer and elevating the vias (21) on the conductive layer by a magnitude (e), etching the stratified insulating layer in such a manner as to obtain a layer placed under the upper face of the vias of the magnitude (e), and eliminating the upper portion (e) of the vias to make them coplanar with the surface of the etched insulating layer.

14. A connection board (10) for at least one very large scale integrated circuit, including a multi-layer structure (12) comprising alternating conducive and insulating layers, each conductive layer including conductors topped with vias (21), the insulating layers being substantially coplanar with the upper faces of the vias (21) of the subjacent conductive layer and made in accordance with the method defined by claim 2.

15. The board of claim 14, characterized in that the insulating layers are made of a polymerized material.

16. A connection board (10) for at least one very large scale integrated circuit, including a multi-layer structure (12) comprising alternating conducive and insulating layers, each conductive layer including conductors topped with vias (21), the insulating layers being substantially coplanar with the upper faces of the vias (21) of the subjacent conductive layer and made in accordance with the method defined by claim 3.

17. A connection board (10) for at least one very large scale integrated circuit, including a multi-layer structure (12) comprising alternating conducive and insulating layers, each conductive layer including conductors topped with vias (21), the insulating layers being substantially coplanar with the upper faces of the vias (21) of the subjacent conductive layer and made in accordance with the method defined by claim 4.

18. A connection board (10) for at least one very large scale integrated circuit, including a multi-layer structure (12) comprising alternating conducive and insulating layers, each conductive layer including conductors topped with vias (21), the insulating layers being substantially coplanar with the upper faces of the vias (21) of the subjacent conductive layer and made in accordance with the method defined by claim 5.

19. A connection board (10) for at least one very large scale integrated circuit, including a multi-layer structure (12) comprising alternating conducive and insulating layers, each conductive layer including conductors topped with vias (21), the insulating layers being substantially coplanar with the upper faces of the vias (21) of the subjacent conductive layer and made in accordance with the method defined by claim 9.

20. The method of claim 1, further comprising etching the insulating layer uniformly over the entire surface of the insulating layer to uncover predetermined portions of the conductive layer.

21. A connection board (10) for at least one very large scale integrated circuit, including a multi-layer structure (12) comprising alternating conductive and insulating layers, each conductive layer including conductors topped with vias (21), the insulating layers being substantially coplanar with the upper faces of the vias (21) of the subjacent conductive layer and the uppermost insulating layers having steps of a maximum height (S) not greater than a predetermined value (V), wherein said step height (S) is equal to a height $(SN) = H(1-DOP)^n$, wherein:

H is a maximum height for a subjacent conductive layer;

DOP is a planarization factor of a material used to form said uppermost insulating layers; and n represents a number of strata of said insulating layer, which is an integer $\geq 1$.

* * * * *

UNITED STATES PATENT AND TRADEMARK OFFICE
CERTIFICATE OF CORRECTION

PATENT NO. : 5,082,718
DATED : January 21, 1992
INVENTOR(S) : Philippe CHANTRAINE, et al It is certified that error appears in the above-identified patent and that said Letters Patent is hereby corrected as shown below:

Col. 9, line 14, (Claim 1, line 10), "$H(1-DOP)^1$" should be -- $H(1-DOP)^n$ --.

Col. 10, line 10, (Claim 14, line 3), "conducive" should be -- conductive --.

Col. 10, line 20, (Claim 16, line 3), "conducive" should be -- conductive --.

Col. 10, line 28, (Claim 17, line 3), "conducive" should be -- conductive --.

Col. 10, line 35, (Claim 18, line 3), "conducive" should be -- conductive --.

Col. 10, line 42, (Claim 19, line 3), "conducive" should be -- conductive --.

Signed and Sealed this

Eighth Day of June, 1993

Attest:

MICHAEL K. KIRK

Attesting Officer

Acting Commissioner of Patents and Trademarks